(12) United States Patent
Chauhan et al.

(10) Patent No.: US 11,545,418 B2
(45) Date of Patent: Jan. 3, 2023

(54) THERMAL CAPACITY CONTROL FOR RELATIVE TEMPERATURE-BASED THERMAL SHUTDOWN

(71) Applicant: TEXAS INSTRUMENTS INCORPORATED, Dallas, TX (US)

(72) Inventors: Ankur Chauhan, Bangalore (IN); Paragkumar Chaudhari, Bengaluru (IN); Vishal Gupta, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 200 days.

(21) Appl. No.: 16/369,795

(22) Filed: Mar. 29, 2019

(65) Prior Publication Data
US 2020/0136369 A1      Apr. 30, 2020

(30) Foreign Application Priority Data
Oct. 24, 2018    (IN) .............................. 201841040079

(51) Int. Cl.
*H02H 5/04*      (2006.01)
*H01L 23/495*    (2006.01)
(Continued)

(52) U.S. Cl.
CPC ........ *H01L 23/49513* (2013.01); *H01L 21/50* (2013.01); *H01L 23/49548* (2013.01);
(Continued)

(58) Field of Classification Search
CPC .......... H02H 5/04; H02H 5/041; H02H 5/042; H02H 5/043; H02H 5/044; H02H 5/045; H02H 5/046; H02H 5/047; H02H 5/048; G01R 31/26; G01R 11/18; G01R 11/185; G01R 19/32; G01R 21/14; G01R 31/2872;
(Continued)

(56) References Cited

U.S. PATENT DOCUMENTS 6,137,165 A * 10/2000 Thierry ................... H01L 24/49
  257/691
6,154,012 A * 11/2000 Drori .................. H02J 7/00036
  320/162

(Continued)

*Primary Examiner* — Scott Bauer
(74) *Attorney, Agent, or Firm* — Ray A. King; Frank D. Cimino

(57) ABSTRACT

A device includes a relative temperature detector configured to determine a temperature difference between a device temperature sensed near a switch device and an ambient temperature sensed outside the switch device. The relative temperature detector is configured to generate a relative temperature output signal based on comparing the temperature difference to a relative temperature threshold. A power detector is configured to generate a power level signal based on comparing an indication of switch power of the switch device to a power threshold. The power level signal specifies whether the indication of switch power is above or below the power threshold. A thermal capacity control is configured to disable the switch device based on the power level signal specifying that the indication of switch power is above the power threshold and based on the relative temperature output signal indicating the temperature difference is above the relative temperature threshold.

20 Claims, 10 Drawing Sheets

(51) Int. Cl.
*H01L 21/50* (2006.01)
*H01L 21/60* (2006.01)

(52) U.S. Cl.
CPC ....... *H01L 23/49558* (2013.01); *H02H 5/042* (2013.01); *H02H 5/047* (2013.01); *H01L 2021/60015* (2013.01)

(58) Field of Classification Search
CPC .............. G01R 31/2874; G01R 1/0458; H01H 11/0062; H01H 2011/0068; H01H 37/10; H01H 37/12; H03K 2017/0806; H03K 17/08–0828; H03K 17/14; H03K 17/145; H03K 19/00369; H03K 19/00376; H03K 19/00384
See application file for complete search history.

(56) References Cited

U.S. PATENT DOCUMENTS

| | | | | |
|---|---|---|---|---|
| 6,504,697 | B1* | 1/2003 | Hille | H03K 17/0822 361/103 |
| 8,299,767 | B1* | 10/2012 | Tuozzolo | H03K 17/0822 323/277 |
| 2003/0179033 | A1* | 9/2003 | Bienvenu | G05F 3/245 327/427 |
| 2007/0216461 | A1* | 9/2007 | Morino | H01L 27/0248 327/287 |
| 2008/0055799 | A1* | 3/2008 | Serizawa | H02H 7/0833 361/24 |
| 2009/0072887 | A1* | 3/2009 | Scheikl | H03K 17/0822 327/530 |
| 2010/0046123 | A1* | 2/2010 | Fukami | H03K 17/0822 361/18 |
| 2010/0079197 | A1* | 4/2010 | Ladurner | H03K 17/0822 327/512 |
| 2011/0051302 | A1* | 3/2011 | Dibra | H03K 17/0822 361/86 |
| 2011/0109372 | A1* | 5/2011 | Zanardi | G01K 3/10 327/512 |
| 2011/0156799 | A1* | 6/2011 | Zanardi | G01K 13/00 327/512 |
| 2011/0316606 | A1* | 12/2011 | Ladurner | H03K 17/14 327/378 |
| 2013/0345892 | A1* | 12/2013 | Lin | H03K 19/00369 700/299 |
| 2015/0330841 | A1* | 11/2015 | Kern | H05K 7/20209 700/275 |
| 2016/0099711 | A1* | 4/2016 | Uemura | H03K 17/145 315/77 |
| 2017/0184658 | A1* | 6/2017 | Uemura | G01R 31/006 |
| 2018/0241203 | A1* | 8/2018 | Irissou | H02H 3/085 |
| 2018/0375506 | A1* | 12/2018 | Tanemura | H03K 17/0822 |
| 2019/0190512 | A1* | 6/2019 | Takuma | H02H 5/04 |
| 2019/0279977 | A1* | 9/2019 | Ma | H01L 27/0277 |

* cited by examiner

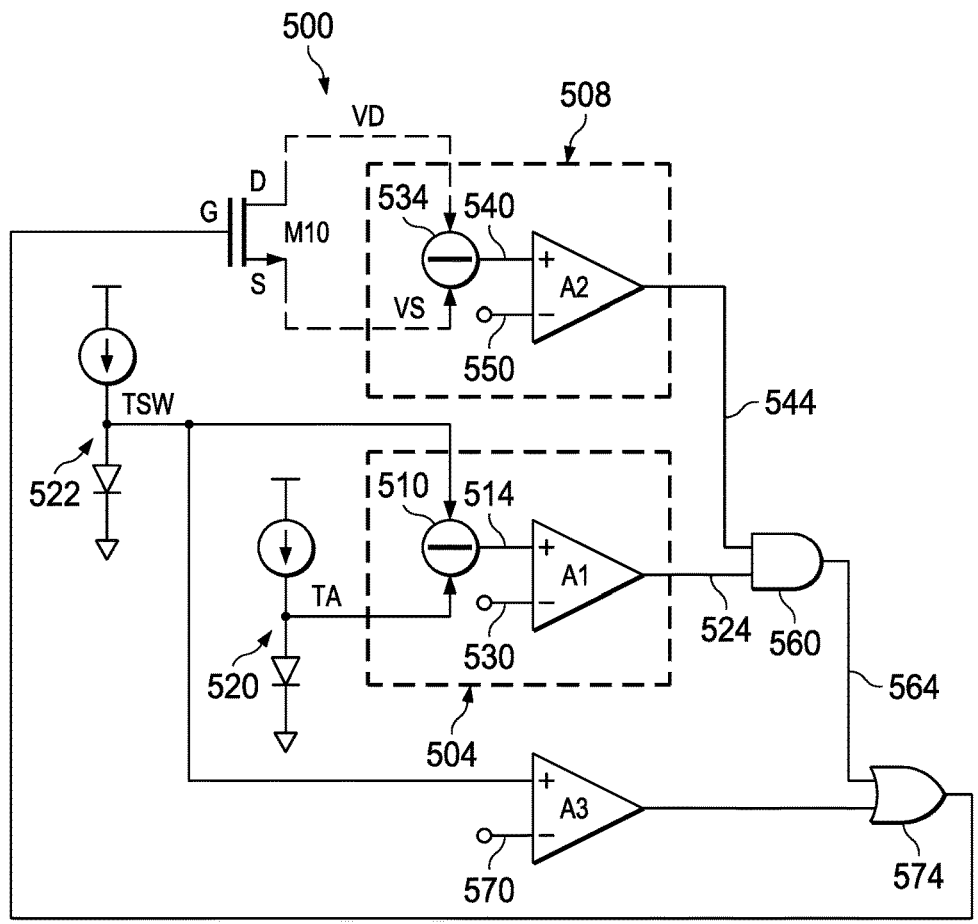
FIG. 5
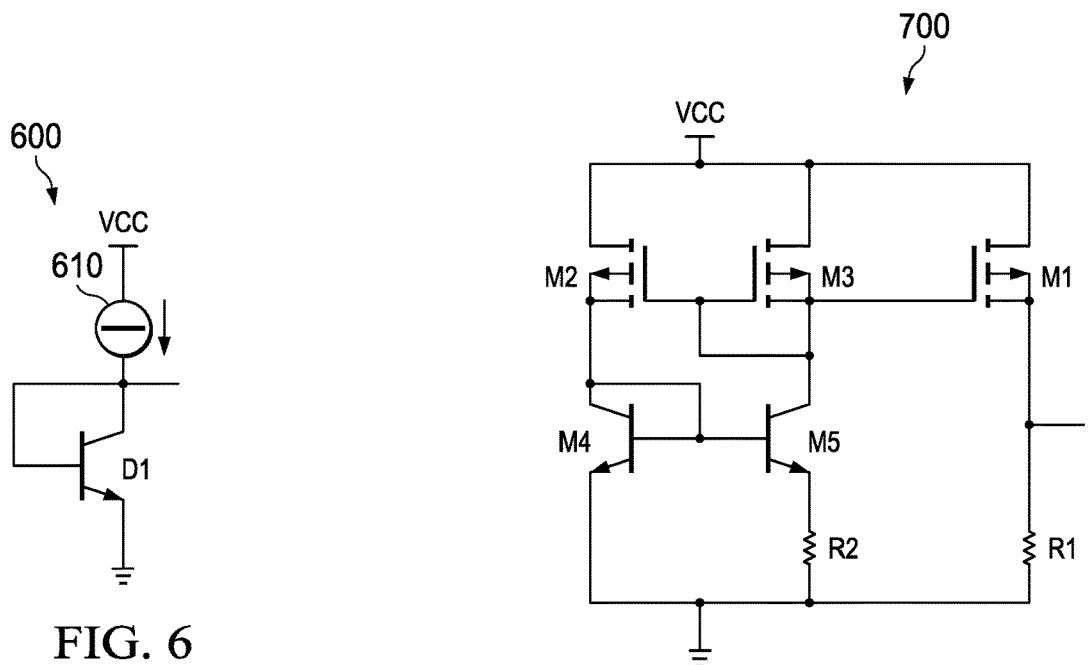
FIG. 6
FIG. 7

THERMAL CAPACITY CONTROL FOR RELATIVE TEMPERATURE-BASED THERMAL SHUTDOWN

CROSS REFERENCE TO RELATED APPLICATIONS

This application claims the benefit of India Provisional Patent Application 201841040079 filed on 24 Oct. 2018, and entitled "AN ARCHITECTURE TO IMPROVE TRANSIENT THERMAL PERFORMANCE OF RELATIVE TEMPERATURE BASED TSD SCHEME", the entirety of which is incorporated by reference herein.

TECHNICAL FIELD

This disclosure relates to a thermal shutdown system, circuit, and device that controls thermal capacity of a thermal shutdown system based on detected power levels of the device.

BACKGROUND

During power delivery to a load, a power transistor, such as a power Field Effect Transistors (FET), develops a thermal gradient across the FET while dissipating power. To facilitate FET reliability over lifetime and operation within a defined safe operating area (SOA), it is desirable to maintain the peak temperature (Tpk) on a given FET to be less than a specified maximum junction temperature value referred to as Tj_max. It may not always be possible to place a thermal sensor for detecting Tj_max near the actual point where the FET substrate reaches Tj_max. In such cases, there may be a difference between Tpk and sensed temperature of the switch (TSW) across the substrate. The difference between Tpk and TSW is a function of ambient temperature (TA), power dissipation levels and other factors. A temperature-based thermal protection circuit can be used to detect the actual point of peak temperature for a given FET; however, the given FET under protection may still be under-utilized from a power capability perspective.

SUMMARY

In one example, a device includes a relative temperature detector configured to determine a temperature difference between a device temperature sensed near a switch device and an ambient temperature sensed outside the switch device. The relative temperature detector is configured to generate a relative temperature output signal based on comparing the temperature difference to a relative temperature threshold. A power detector is configured to generate a power level signal based on comparing an indication of switch power of the switch device to a power threshold. The power level signal specifies whether the indication of switch power is above or below the power threshold. A thermal capacity control is configured to disable the switch device based on the power level signal specifying that the indication of switch power is above the power threshold and based on the relative temperature output signal indicating the temperature difference is above the relative temperature threshold.

In another example, a circuit includes a subtractor configured to generate a difference output signal based on subtracting an ambient temperature measurement outside a switch device from a device temperature measurement near the switch device. A first comparator is configured to generate a relative temperature output signal based on comparing the difference output signal to a relative temperature threshold. A voltage sensor is configured to generate a sensor output signal based on a voltage sensed across the switch device. A second comparator is configured to generate a power level signal based on comparing the sensor output signal to a power threshold. A thermal capacity control is configured to generate a thermal capacity output signal based on the relative temperature output signal and the power level signal. The thermal capacity control is configured to disable the relative temperature output signal based on the sensor output signal being detected below the power threshold.

In yet another example, a method includes receiving an indication of relative temperature based on a temperature of a switch device and an ambient temperature. The method includes receiving an indication of switch power for the switch device. The method includes comparing the relative temperature indication with a relative temperature threshold to provide a thermal shutdown control signal based on the relative temperature indication being above the threshold. The method includes comparing the switch power indication with a power threshold to provide an indication of switch power. The method includes overriding the thermal shutdown signal to enable the switch device based on the switch power indication being below the power threshold.

BRIEF DESCRIPTION OF THE DRAWINGS

FIG. 5 illustrates an example circuit diagram of a circuit to regulate thermal capacity of a switch device based on detected power levels and sensed temperatures of the device.

FIG. 6 illustrates an example of a circuit to sense temperature of a switch device based on diode sensing.

FIG. 7 illustrates an example of a circuit to sense temperature of a switch device based on scaled current sensing.

DETAILED DESCRIPTION

Figure 1:
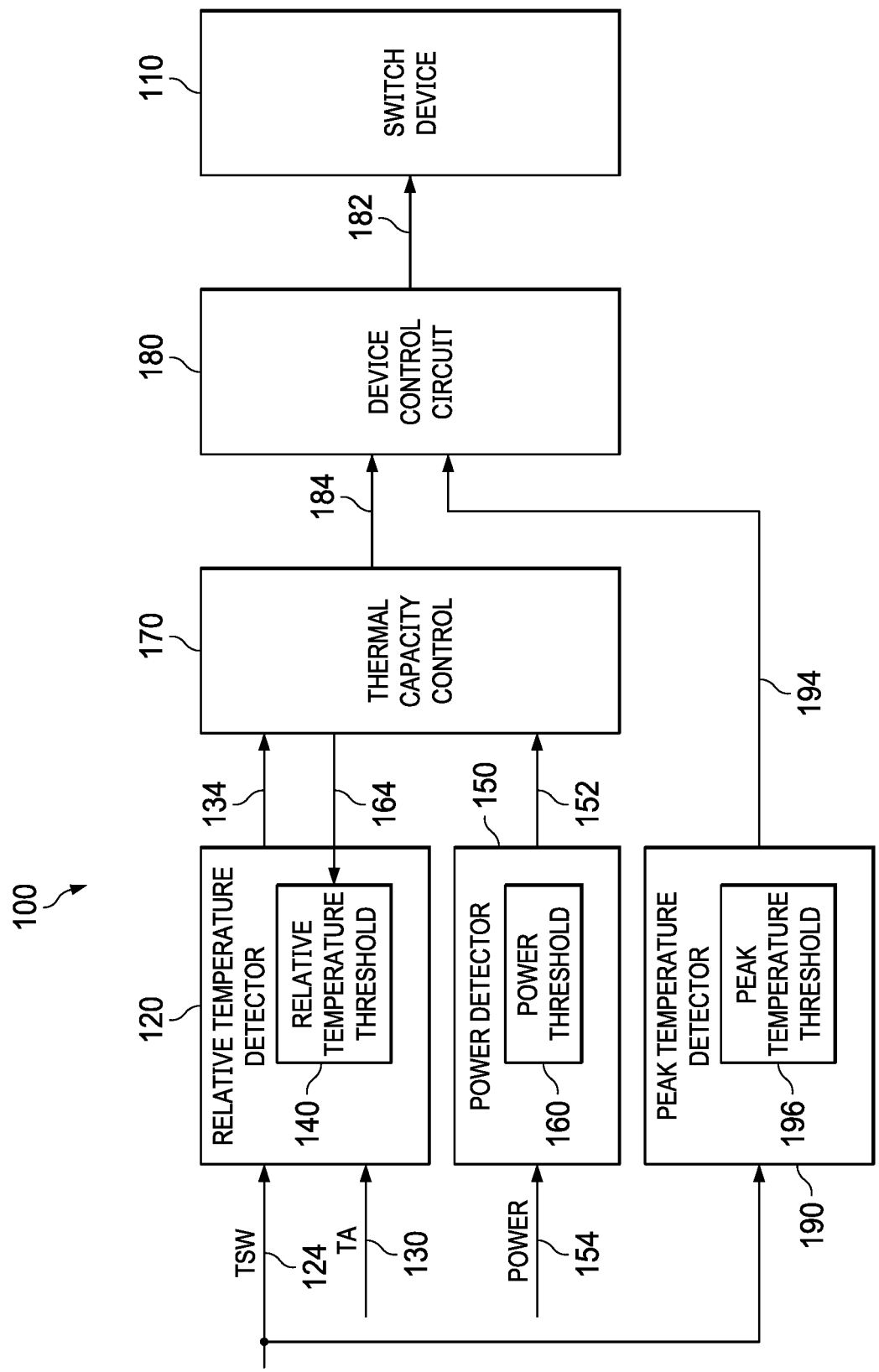
FIG. 1 illustrates an example block diagram of a system to regulate thermal capacity of a switch device based on detected power levels and sensed temperatures of the device.

This disclosure introduces a system with thermal shutdown capability. The disclosed device, circuit, and method are configured to regulate thermal capacity of a switch device based on detected power levels of the device. A relative-temperature detector is configured to sense temperatures across a given transistor switch device. Based on the sensed temperatures, the relative-temperature detector can enable or disable operation of the switch device at higher power levels of the device, such as when power levels of the switch device are detected above a given power threshold. A power capability detector is configured to sense the power levels of the switch device with respect to a power threshold, including at lower power levels. A thermal capacity control is configured to enable or disable operations of the switch device based on the relative-temperature output and detected power levels. Thus, at lower detected power levels of the switch device, more power can be delivered by the switch device for short, transient time-periods under desired thermal operating conditions. This supports various applications that were not supported in relative-temperature-based only systems. For example, at lower power levels, other relative-temperature protection schemes may not allow for maximum power utilization of the switch device since transient power events may be disabled by the relative-temperature detector at such lower power levels.

Examples of applications that may temporarily request higher transient power can include hot swap circuits, electronic fuses, power supply multiplexing, and line drivers. However, by using thermal capacity control, as disclosed herein, transient power events will be permitted in such applications in contrast to previous approaches that implement only relative-temperature detection. Thus, based on the temperature and power-based detection circuits described herein, transient power can be provided for a longer duration of time across the switch device while still facilitating desired junction-temperature operating conditions of the device. The transient power event may be due to a fault in downstream circuits or could be a device requirement (e.g., LED drivers that utilize short bursts of power). This allows downstream systems to operate for longer duration when the switch device is in high-power dissipation mode during transient conditions yet also provide thermal shutdown protection when operating at higher power levels of the switch device.

As used herein, the term "circuit" can include a collection of active and/or passive elements that perform a circuit function, such as an analog circuit or digital circuit. Additionally or alternatively, for example, the term "circuit" can include an IC where all or some of the circuit elements are fabricated on a common substrate (e.g., semiconductor substrate, such as a die or chip), such as disclosed herein. For example, the circuit and/or associated control circuitry may be implemented as a respective IC chip or within a multi-chip module.

FIG. 1 illustrates an example of a device 100 configured to regulate thermal capacity of a switch device 110 based on detected power levels and sensed temperatures of the device. As used herein, the term regulate refers to controls implemented based on monitoring temperature inputs of a thermal control path for the switch device 110 and a power input from a power control path for the switch device. For example, if power levels are detected below a given power threshold in the power control path for the switch device 110, the power control path overrides the thermal control path to disable thermal shutdown and keep the switch device ON. This allows additional power (also referred to as transient power) to flow in the switch device for a period of time. Examples of a thermal control path and a power control path are illustrated in FIG. 5. The switch device 110 can be substantially any type of transistor device including bipolar transistor, field effect transistor (FET), such as metallic oxide semiconductor FET (MOSFET), Group III-V transistor, such as gallium nitride (GaN) transistor, isolated gate bipolar transistor (IGBT), and silicon carbide (SiC) transistor.

The device 100 includes a relative temperature detector 120 configured to determine a temperature difference between temperature of the switch device 110, which is referred to as switch temperature (TSW) 124 sensed near the switch device 110 and an ambient temperature TA 130 sensed outside the switch device. As used herein, the term near refers to a location of a temperature sensor to measure TSW 124 that is on the same die as the switch device 110. For example, the temperature sensor is located adjacent to the switch device on the die, such as located within a distance that is about 20% of a cross-sectional dimension (e.g., diameter) of the die on which the switch device resides. The relative temperature detector 120 is configured to generate a relative temperature output signal 134 (e.g., analog signal representing difference or digital signal indicating there is a difference) based on a comparison between the temperature difference to a relative temperature threshold 140. The relative temperature detector 120 thus can determine a value for this relative temperature based on a comparison of TSW 124 and TA 130 with respect to the relative temperature threshold 140. The relative temperature detector 120 may receive two voltage/current signals each representative of the corresponding sensed temperatures TSW 124 and TA 130.

A power detector 150 is configured to generate a power level signal 152 (e.g., analog signal representing difference or digital signal indicating there is a difference) based on a comparison between an indication of power 154 (e.g., voltage, current, voltage/current analog or digital value representing power) of the switch device 110 to a power threshold 160. In an example, the indication of power 154 detected from the switch device 110 can be sensed as a voltage potential across the switch device 110 that is representative of switch power (see, e.g., FIG. 5). In other examples, the indication of power 154 can be an analog value or converted digital value that is a function of sensed voltage across the switch device, sensed current flowing through the device, or a sensed voltage and sensed current product sensed from the device.

A thermal capacity control 170 is configured to enable the switch device 110 to provide power based on the indication of power 154 of the switch device 110 being detected below the power threshold 160. With respect to a switch device (e.g., switch device 110), transient power may be a short duration burst in power (e.g., due to increased voltage and/or current) resulting from a state change in the switch device (e.g., from an off to an on state) or a sudden change in load conditions. For example, in response to activating the switch device to provide power to a load, the switch device may experience high in-rush current resulting in an increase in transient power. The device 100 disclosed herein enables an increase in the transient power for the switch device 110 by controlling the thermal operating range of the switch device based on the indication of power 154 of the switch device. Advantageously, this may result in an increase in the duration that the switch device 110 operates (e.g., at power levels below power threshold 160) and, in turn, improve the SOA of the switch device.

The thermal capacity control 170 is configured to trigger thermal shutdown and disable the switch device 110 based on the indication of power 154 of the switch device 110 being detected above the power threshold 160 and based on the relative temperature output signal 134 indicating the temperature difference is detected above the relative temperature threshold 140. The thermal capacity control 170 can be configured to regulate the thermal shutdown control implemented by the relative temperature detector 120 based on the power level of the switch. In one implementation, for example, the thermal capacity control 170 can be configured to regulate the relative temperature threshold 140 with control signal 164 (see, e.g., FIG. 2), to select between relative temperature thresholds based on the indication of power 154 (see, e.g., FIG. 3), and/or utilize gating circuitry to block the relative temperature output signal 134 at lower power levels (see, e.g., FIGS. 4 and 5).

By regulating the relative temperature detector 120 in this manner, at low power levels of the switch device 110 as indicated by the power level signal 152 from the power detector 150, higher power can be delivered to the switch device 110 during such periods of lower power levels than if the thermal shutdown were controlled solely based on the relative temperature output signal 134. If the power detector 150 indicates by the power level signal 152 that the received indication of power 154 is above the power threshold 160, then the thermal capacity control 170 can re-enable the relative temperature detector 120 for implementing higher thermal protection of the switch device 110 at such higher power levels.

A device control circuit 180 (e.g., analog or logic gate) is configured to enable or disable the switch device 110 with signal 182 (e.g., by controlling its gate input) in response to a first control signal 184 from the thermal capacity control 170 and a second control signal 194 from a peak temperature detector 190. For example, the signal 182 can be generated as the output of a logic gate or asserted as an output from a control circuit. The peak temperature detector 190 is configured to generate a second control signal 194 to the device control circuit 180 based on the sensed temperature being compared to an absolute temperature threshold 196. The device control circuit 180 thus is also configured to enable or disable the switch device 110 based on the second control signal 194.

Figure 2:
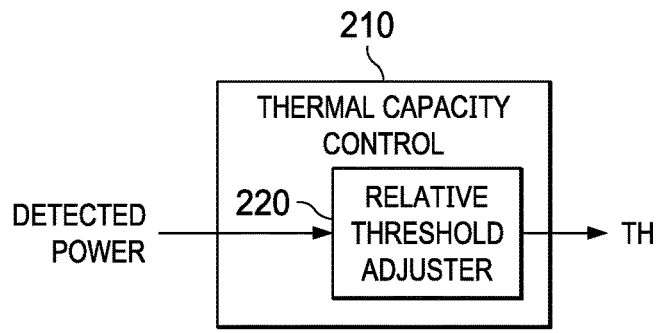
FIG. 2 illustrates an example block diagram of a thermal capacity control that employs a relative threshold adjuster to regulate thermal capacity of a switch device.

FIG. 2 illustrates an example of a thermal capacity control 200 that includes a relative threshold adjuster 220 configured to regulate thermal capacity of thermal shutdown system (e.g., the device 100 of FIG. 1). In this example, the relative threshold adjuster 220 is configured to control a relative temperature threshold (TH) of the relative temperature detector (e.g., relative temperature detector 120 of FIG. 1) based on the indication of power (e.g., 154 of FIG. 1) of the switch device. For example, if the indication of power is detected below the power threshold by the power detector (e.g., power detector 150 of FIG. 1), the relative threshold adjuster 220 may increase the temperature threshold (TH) of the relative temperature detector.

If the indication of power is above the threshold, TH can be decreased to mitigate excessive power in the switch device. Relative threshold adjuster 220 can implement analog adjustments, digital adjustments, and/or a combination of analog or digital adjustments to the relative temperature threshold (e.g., relative temperature threshold 140 of FIG. 1) described herein. By moving the temperature threshold of the relative temperature detector, the thermal capacity control 210 regulates the thermal shutdown control being implemented by the relative temperature detector such that the SOA of the switch device is expanded at lower power levels, as determined by the power detector.

Figure 3:
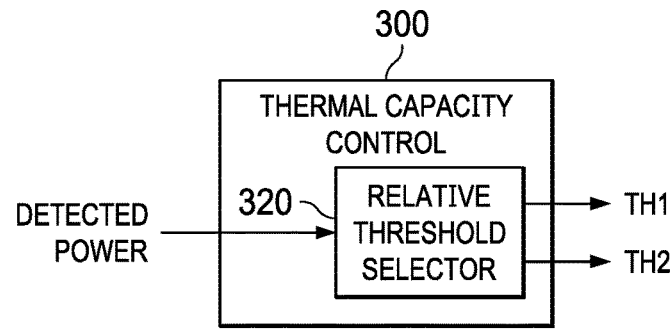
FIG. 3 illustrates an example block diagram of a thermal capacity control that employs a relative threshold selector to regulate thermal capacity of a switch device.

FIG. 3 illustrates another example of a thermal capacity control 300 (e.g., corresponding to thermal capacity control 170 of FIG. 1) that includes a relative threshold selector 320. The relative threshold selector 320 is configured to regulate thermal capacity of a switch device. The thermal capacity control 300 is configured to select between at least two relative temperature thresholds shown as TH1 and TH2 that are employed by the relative temperature detector described herein. The thresholds TH1 and TH2 can be stored in a memory or register bank and can be selected based on the detected power level of the switch device. For example, the thermal capacity control 300 can be configured to select a first of the at least two relative temperature thresholds TH1 based on the indication of power of the switch device (e.g., indication of power 154 of FIG. 1) being detected below the power threshold (e.g., 160 of FIG. 1) by the power detector (e.g., power detector 150 of FIG. 1). The thermal capacity control 170 can be configured to select a second of the at least two relative temperature thresholds TH2 based on the indication of power of the switch device being detected above the power threshold by the power detector. Thus, at low power levels, as detected by the power detector, a higher relative threshold can be selected to effectively increase the SOA of the switch device.

Figure 4:
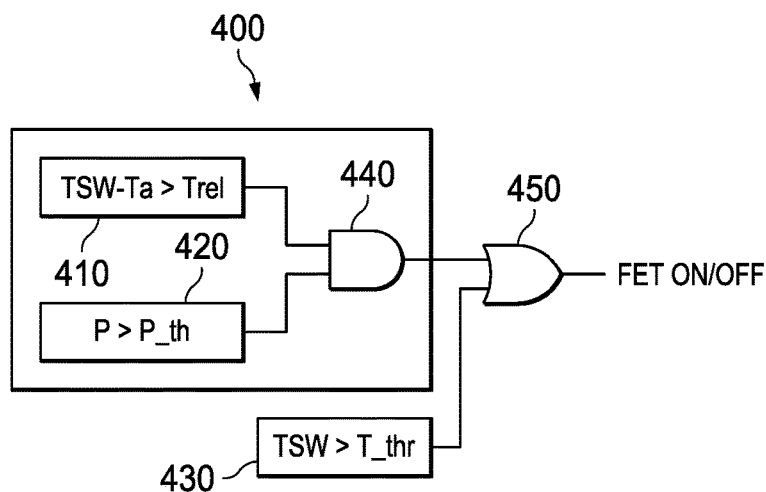
FIG. 4 illustrates an example block diagram of a circuit to regulate thermal capacity of a switch device based on detected power levels and sensed temperatures of the device.

FIG. 4 illustrates an example a circuit 400 to regulate thermal capacity of a switch device based on detected power levels and sensed temperatures of the device. In contrast to the examples of FIGS. 2 and 3 that employ relative temperature threshold adjustment, the circuit 400 employs gating logic to block the relative temperature threshold output (e.g. relative temperature output signal 134 of FIG. 1) during lower detected power levels of the switch device. In this example, a relative temperature detector 410 is shown as analog and/or digital logic block TSW−TA>TREL, where TREL is the relative temperature threshold described herein. A power detector 420 is represented by logic block P>P_PTH, where P is switch device power and P_TH is the power threshold described herein. A peak detector 430 is represented by logic block TSW>T_THR which represents the absolute or peak temperature threshold described herein. In this example, the thermal capacity control is configured as a logic gate 440 (e.g., AND gate) to disable the relative temperature output (e.g., relative temperature output signal 134 of FIG. 1) based on the received power level P of the switch device being detected below the power threshold by the power detector 420. A device control circuit 450 receives output from peak detector 430 and logic gate 440 to control a switch device by output signal FET ON/OFF which can be applied to control a gate input of a switch device (not shown).

FIG. 5 illustrates an example of a circuit 500 to regulate thermal capacity of a switch device M10 based on detected power levels and sensed temperatures of the device. The circuit 500 is an example of the circuit 400 depicted in FIG. 4. The circuit 500 includes a relative temperature detector 504 (e.g., 120 of FIG. 1, 410 of FIG. 4) and a power detector 508 (e.g., 150 of FIG. 1 and 420 of FIG. 4). The relative temperature detector 504 is part of a thermal control path to control shutdown of the switch device M10 at high sensed temperatures of the switch device. The power detector 508 is part of a power control path, which is configured to override the thermal control path of the relative temperature detector 504 based on sensed power levels of the switch device M10 being detected below a power threshold.

The circuit 500 includes a first subtractor 510 (e.g., subtraction circuit) in the relative temperature detector 504 is configured to generate a first difference output signal 514 based on a difference between a sensed temperature measurement TSW of the switch device M10 and an ambient temperature measurement TA. For example, a thermal diode circuit 522 is configured as a device temperature sensor to provide an indication of the temperature measurement (e.g., a voltage) TSW for the switch device M10, such as by implementing the diode on the same substrate as the switch device. Another thermal diode circuit 520 is configured as an ambient temperature sensor to provide an indication of a temperature measurement (e.g., a voltage) TA for the substrate outside of the switch device, such as on a different substrate or thermally isolated from the switch device M10. The first subtractor 510 can provide the first difference output signal 514 by subtracting the sensed temperature TSW of the switch device M10 and the sensed ambient temperature TA.

The circuit 500 also includes a voltage sensor (e.g., second subtractor) 534 is configured in the power detector 508 to generate a second difference output signal 540 by subtracting a first voltage parameter of the switch device (e.g., VD) from a second voltage parameter of the switch device (e.g., VS). In this example, the voltage across M10 is indicative and proportional to the power dissipated in M10. The first subtractor 510 and second subtractor 534 described herein can be utilized to execute difference functions, such as shown in relative temperature detector 410 in FIG. 4.

As a further example, a first comparator A1 is configured to generate a relative temperature output signal 524 based on comparing the first difference output signal 514 to a relative temperature threshold 530. The relative temperature output signal 524 functions as a thermal shutdown signal to trigger shutdown of switch device M10 based on detected temperature differences between ambient temperatures and switch device temperatures exceeding the relative temperature threshold 530. A second comparator A2 (e.g., power comparator circuit) is configured to generate a power level signal 544 based on comparing the second difference output signal 540 to a power threshold voltage 550. The power level signal 544 overrides the relative temperature output signal 524 to increase power capacity of the switch device M10 based on indications of power from the switch device being detected below the power threshold voltage 550. The comparators A1 and A2 described herein can be utilized to execute comparison functions such as shown in power detector 420 and relative temperature detector 410.

A thermal capacity control 560 (e.g., an AND gate) is configured to generate a thermal capacity output signal 564 based on the relative temperature output signal 524 and the power level signal 544. The thermal capacity control 560 is configured to override the relative temperature output signal 524 based on the second difference output signal 540 being detected below the power threshold voltage 550. A peak temperature detector A3 can also be provided that compares the temperature measurement TSW of the switch device M10 to a peak temperature threshold at 570. A device control gate (e.g., an OR gate) 574 is configured to control the on/off action of the switch device M10 based on the relative temperature output signal 524 and power level signal 544.

FIG. 6 illustrates an example of a circuit 600 configured to sense temperature. For example, the circuit 600 includes a forward diode circuit where a diode-connected transistor D1 is coupled to ground at its emitter and is driven at its collector by bias source 610 (e.g., a DC bias), which is coupled to a voltage supply VCC. For a given bias, the voltage at the collector of D1 varies based on its temperature. Forward diode drop across D1 reduces with temperature and this thermal property can be used to implement a thermal sensor as described herein. The voltage from the circuit 600 thus can be implemented in the systems disclosed herein (e.g., device 100, circuit 400, circuit 500) to provide temperature measurements. The types of temperature measurements, which vary depending on placement of the circuit 600, can include ambient temperatures (TA) (e.g., 130 of FIG. 1, 520 of FIG. 5), peak junction temperatures (TPK), and sensed temperatures (TSW) (e.g., 124 of FIG. 1, 522 of FIG. 5) of a switch device described herein (e.g., 110 of FIG. 1, M10 of FIG. 5).

FIG. 7 illustrates an example of a circuit 700 to sense temperatures associated with a switch device (e.g., TA outside switch device and TSW of FIGS. 1 and 5) based on scaled current sensing (e.g., scaled current circuit). In this example, the difference in forward bias diode drop for scaled diodes biased with scaled currents changes linearly with temperature (e.g., increases with temperature). This property can also be used to implement a thermal sensor as shown in the circuit 700. The circuit 700 includes transistor M1 coupled to VCC and drives resistor R1 which is coupled to ground. Temperature in volts can be read at the common node of M1 and R1. Current mirrors M2 and M3 drive mirrors M4 and M5 to supply current from VCC through R2 which is coupled to ground.

Figure 8:
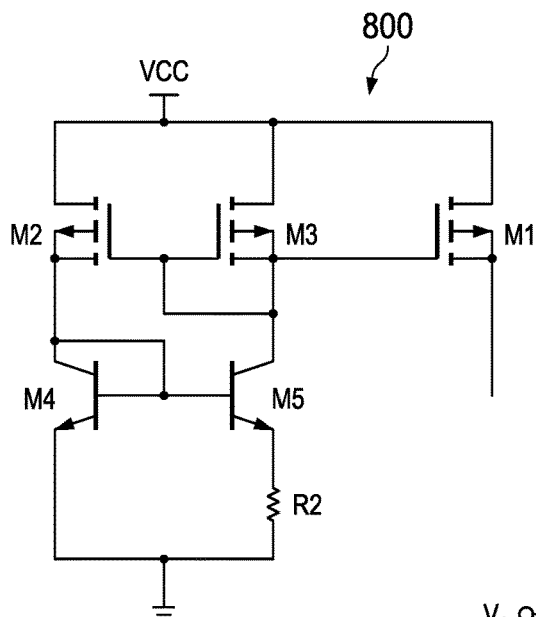
FIG. 8 illustrates an example of a circuit to sense temperature of a switch device based on temperature dependent resistor sensing.

FIG. 8 illustrates an example of a circuit 800 to sense temperatures of a switch device (e.g., TA and TSW of FIGS. 1 and 5) based on temperature-dependent resistor sensing (e.g., temperature-dependent resistor circuit). In this example, value of resistors made from certain materials changes with temperature. This property can be utilized to make thermal sensors as shown in the circuit 800. Similar to the circuit 700 above, the circuit 800 includes current mirrors M2 and M3 that drive mirrors M4 and M5 to supply current from VCC through R2 which is coupled to ground. M1 is common connection of M3 and M5. Output of M1 provides a current that correlates to the current through resistor R2.

Figure 9:
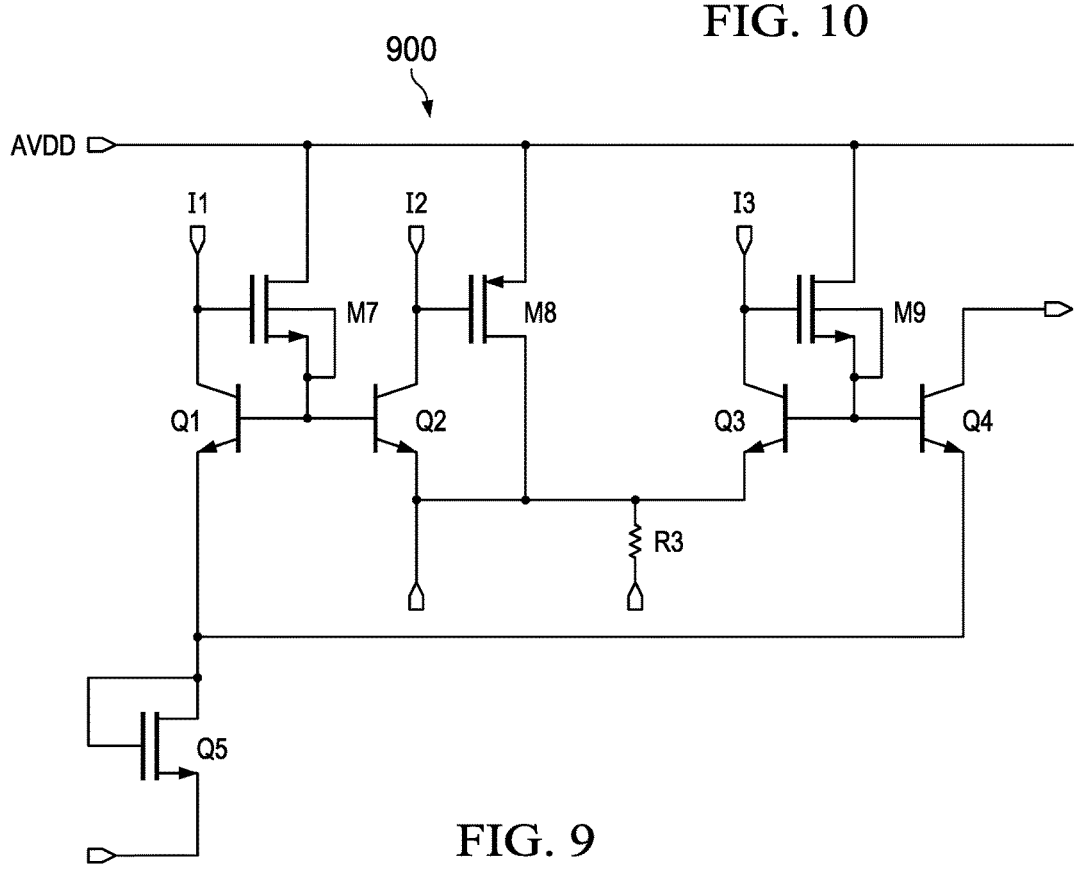
FIG. 9 illustrates an example of a circuit to sense power of a switch device.

FIG. 9 illustrates an example of a circuit 900 to sense power of a switch device (e.g., corresponding to power detector of FIG. 1). The circuit 900 includes a trans-linear circuit that utilizes exponential characteristics of diodes, bipolar transistors, or MOSFETs in sub-thresholds to achieve multiplication. For example, the circuit 900 includes transistors Q1, Q2, and Q3 which are driven from current sources I1, I2, and I3. The emitters of Q2-Q3 are tied together and to resistor R3. The emitter of Q4 drives Q5. M7, M8, and M9 generate bias currents respectively for Q1, Q2, and Q3. In this example, the circuit 900 is configured to perform multiplication of voltage across power element Q4 and current through the power element. Such power determinations can be employed in logic blocks, such as power detector 420 of FIG. 4 where power is compared to a power threshold. There are various other example implementations which can achieve this power detection function.

Figure 10:
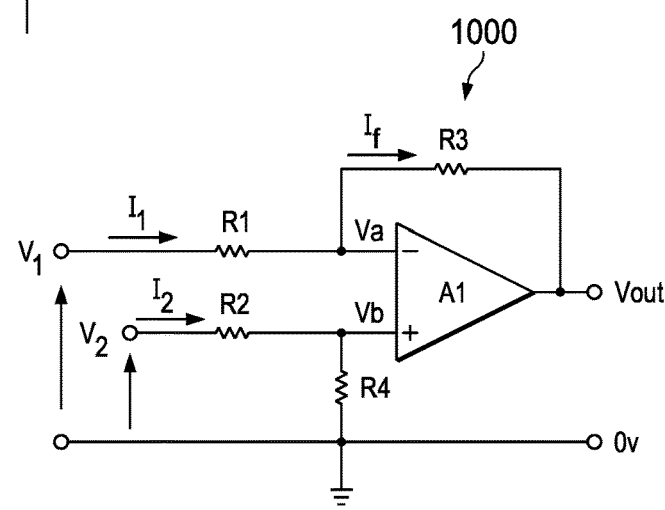
FIG. 10 illustrates an example of a circuit to perform voltage-domain subtraction in a circuit to regulate thermal capacity of a switch device based on detected power levels and sensed temperatures of the device.

FIG. 10 illustrates an example of a circuit 1000 configured to perform voltage-domain subtraction in a circuit to regulate thermal capacity of a switch device based on detected power levels and sensed temperatures of the device. For example, the circuit 1000 can be utilized in relative temperature detector 410 of FIG. 4 and first subtractor 510 and second subtractor 534 of FIG. 5. In this example, amplifier A1 is connected to resistors R1 and R2 which receive voltages V1 and V2 to be subtracted. Feedback resistor R3 can be provided for stability along with resistor R4 coupled to ground from the positive terminal of A1. The output of A1 thus provides an output voltage corresponding to a difference between V2 and V1.

Figure 11:
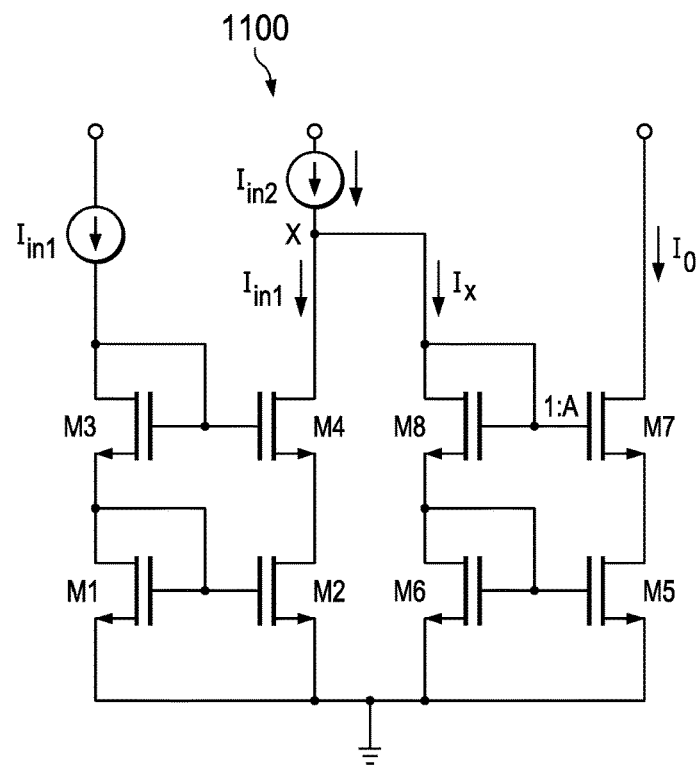
FIG. 11 illustrates an example of a circuit to perform current-domain subtraction in a circuit to regulate thermal capacity of a switch device based on detected power levels and sensed temperatures of the device.

FIG. 11 illustrates another example of a circuit 1100 configured to perform current-domain subtraction in a circuit (e.g., first subtractor 510 of FIG. 5) to regulate thermal capacity of a switch device based on detected power levels and sensed temperatures of the device. In this example, currents IIN1 and IIN2 are subtracted to provide output current Io. M1 and M2 form mirrors that are coupled to mirrors M3 and M4. Similarly, mirrors M5 and M6 are driven from mirrors M7 and M8.

Figure 12:
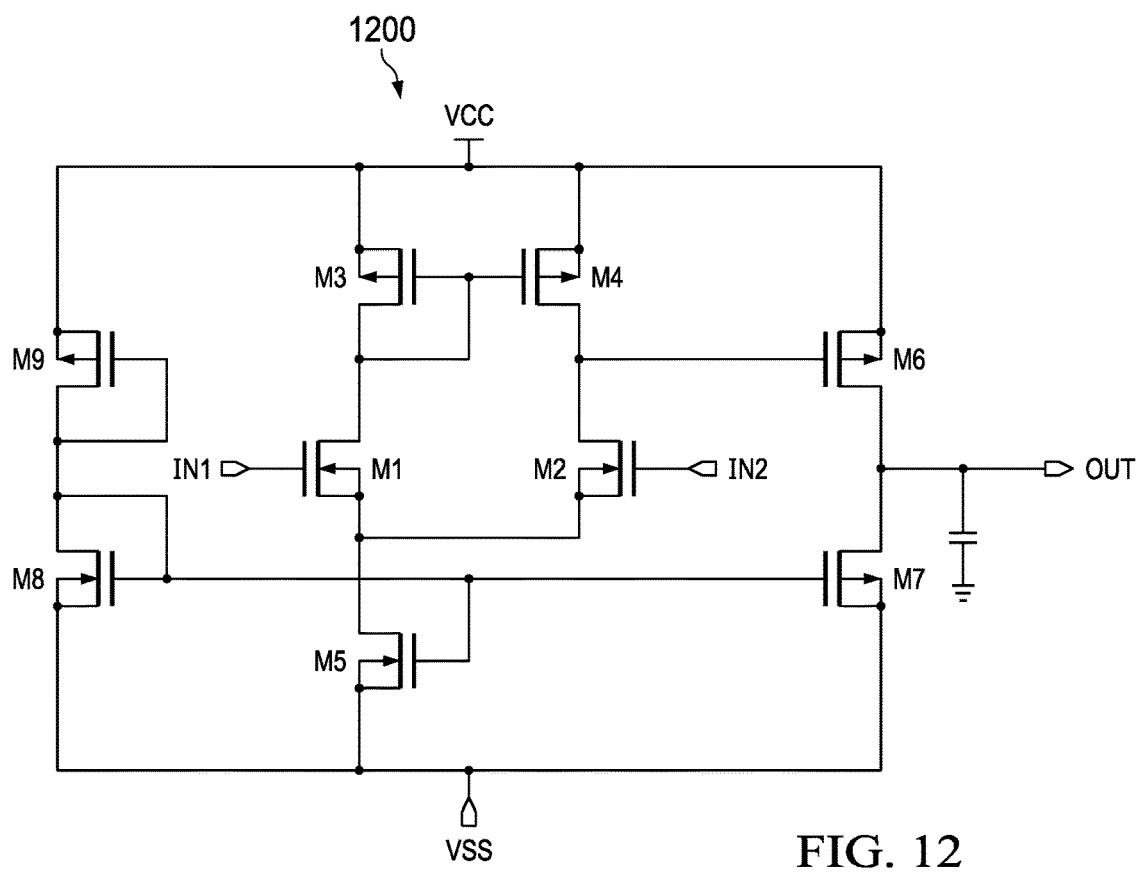
FIG. 12 illustrates an example of a comparator circuit for a circuit to regulate thermal capacity of a switch device based on detected power levels and sensed temperatures of the device.

FIG. 12 illustrates an example of a comparator circuit 1200. For example, the comparator circuit can be used to implement comparators A1, A2, and A3 in FIG. 5. As shown in the example comparator circuit 1200, M1 receives comparator input IN1 and M2 receives comparator input IN2. Output of the comparator is at the common connection of M6 and M7, where the comparator is powered from VCC and ground. The comparator circuit 1200 is but one example of a comparator circuit and each component of this circuit is not described for purposes of brevity.

Figure 13:
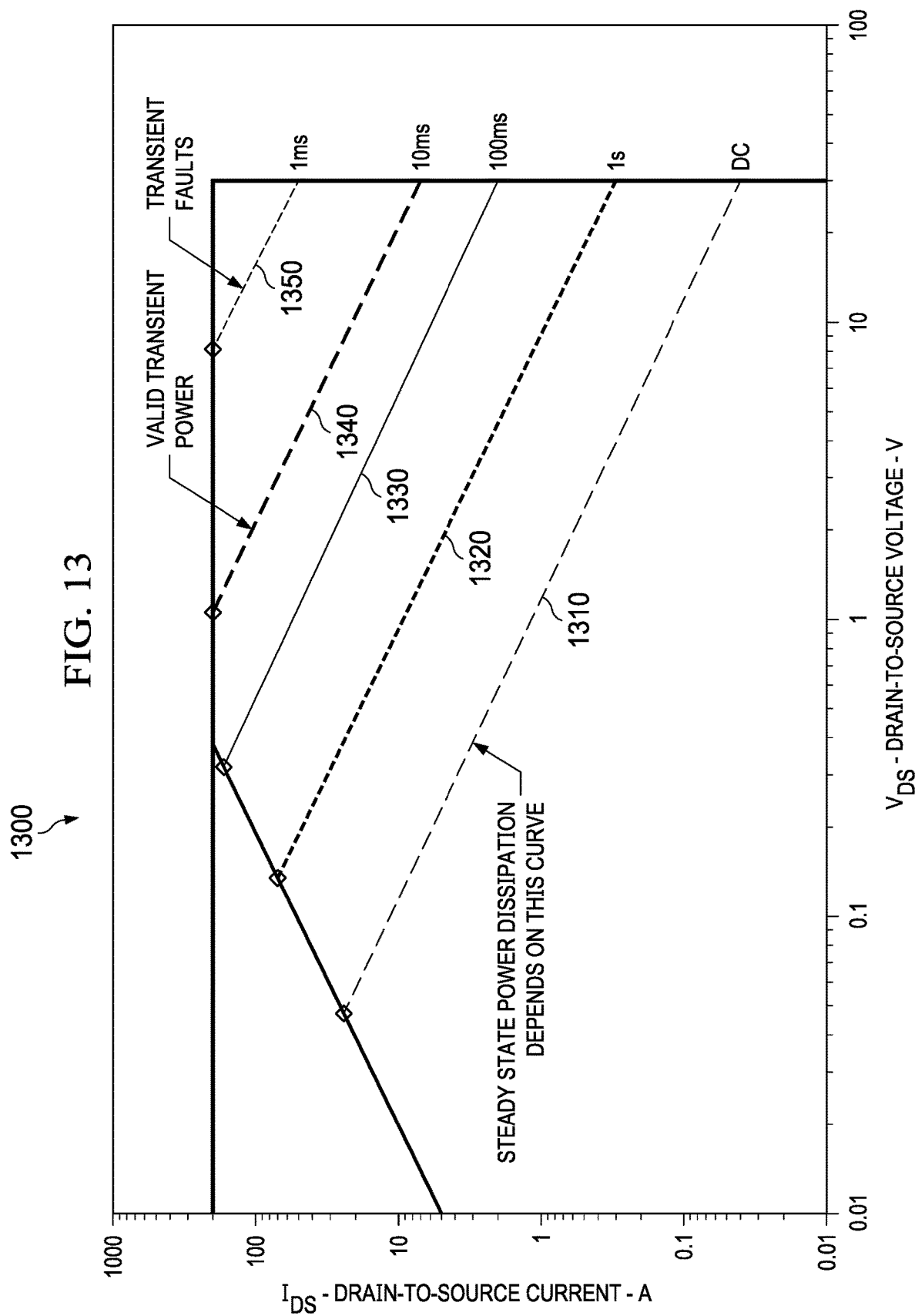
FIG. 13 illustrates an example power dissipation diagram having various power dissipation curves that represent different transient conditions for a circuit configured to regulate thermal capacity of a switch device based on detected power levels and sensed temperatures of the device.

FIG. 13 illustrates an example power dissipation diagram 1300 having various power dissipation curves that represent different transient power conditions of a switch device. Switch drain-to-source voltage is represented on the horizontal axis and switch drain-to-source current is represented on the vertical axis. A curve 1310 represents steady-state power under static direct current conditions. Curves 1320, 1330, and 1340 represent valid transient power curves at pulsed power of 1 second, 100 milliseconds (ms), and 10 ms, respectively, where the switch devices described herein would be on and operating at desired junction temperatures. At 1350, a transient fault line is shown where the switch devices described herein would be shut-off due to both relative-temperature detection and power capacity detection by thermal and power control circuitry as described herein.

Figure 14:
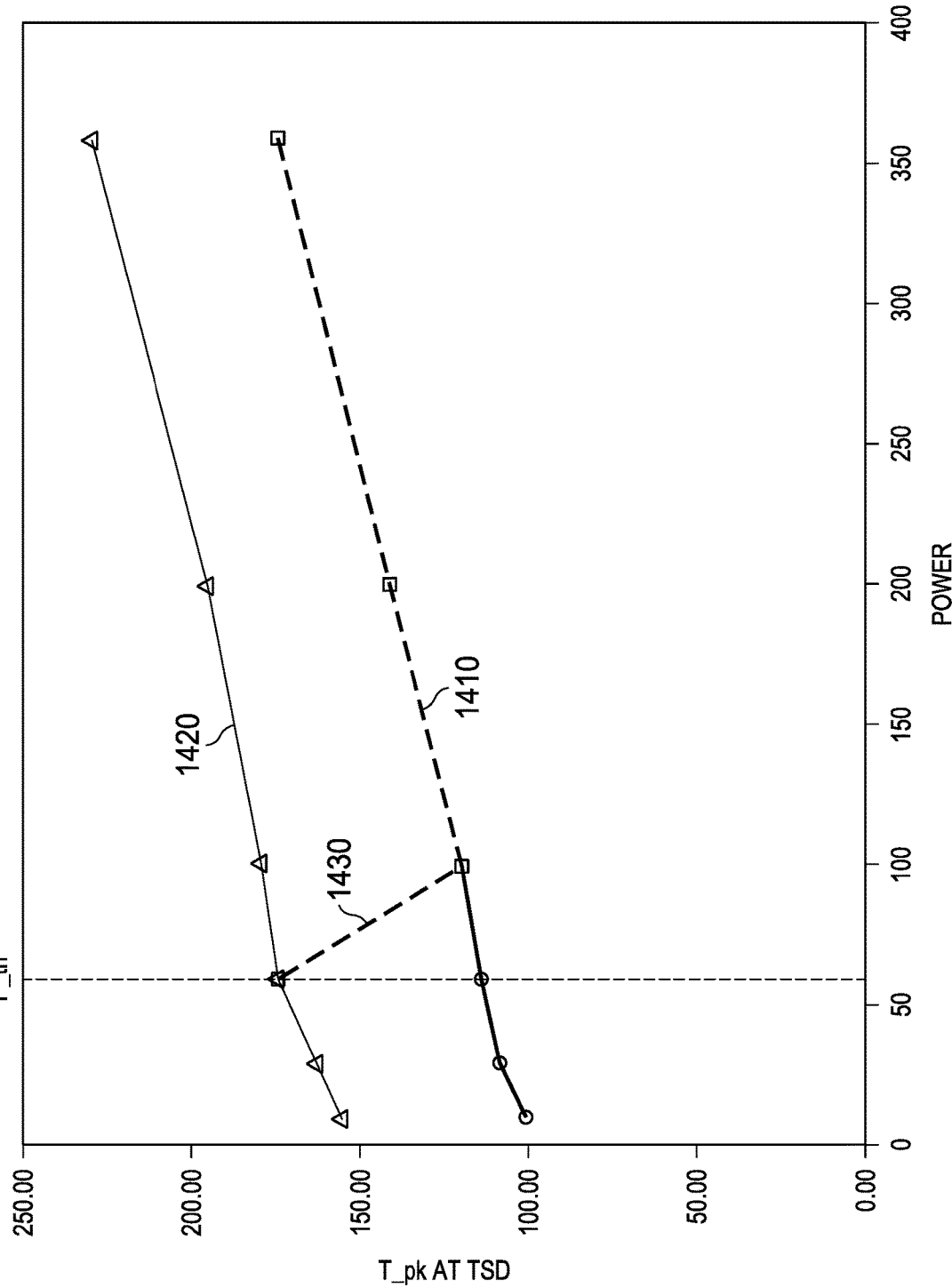
FIG. 14 illustrates an example temperature and power diagram having various power dissipation curves to select desired threshold temperatures for a circuit configured to regulate thermal capacity of a switch device based on detected power levels and sensed temperatures of the device.

FIG. 14 illustrates an example temperature and power diagram 1400 having various power dissipation curves, such as can be used to select desired threshold temperatures for a thermal shutdown system (e.g., system of FIG. 1) as disclosed herein. The horizontal axis represents power of the switch device in Watts and the vertical axis represents peak junction temperature at thermal shutdown in degrees Celsius. A curve 1410 represents peak junction temperature relative temperature disabled and curve 1420 represents relative temperature detection is enabled. A line 1430 can be drawn between the curves to peak temperature and power capabilities of the switch device at a given power threshold shown at line 1430.

Figure 15:
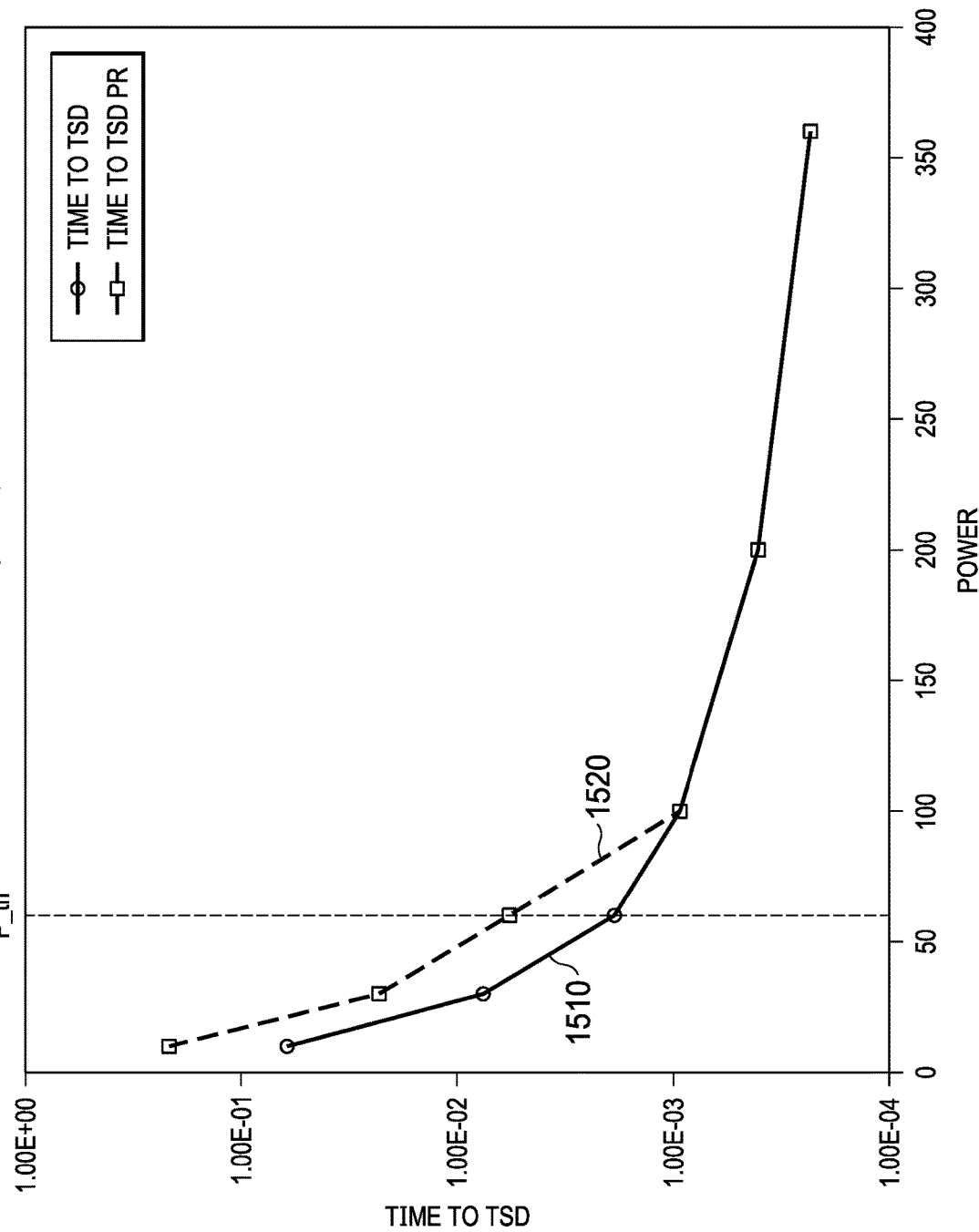
FIG. 15 illustrates an example time-to-shutdown and power diagram having various power dissipation curves showing improvement using power-capability controls for a circuit configured to regulate thermal capacity of a switch device based on detected power levels and sensed temperatures of the device.

FIG. 15 illustrates an example time-to-shutdown and power diagram 1500 having various power dissipation curves showing improvement using power-capability controls for thermal shutdown system, such as disclosed herein. Switch device power is represented on the horizontal axis in Watts and time until thermal shutdown (TSD) is shown on the vertical axis in seconds. Under previous relative temperature-based circuits, a curve 1510 shows that less power is delivered and thermal shut down occurs earlier than a curve 1520, especially at lower power levels (e.g., below a power threshold P_th). The curve 1520 represents TSD as a function of power for a thermal shutdown system implementing both relative-temperature and the power capacity detection circuits as described herein.

Figure 16:
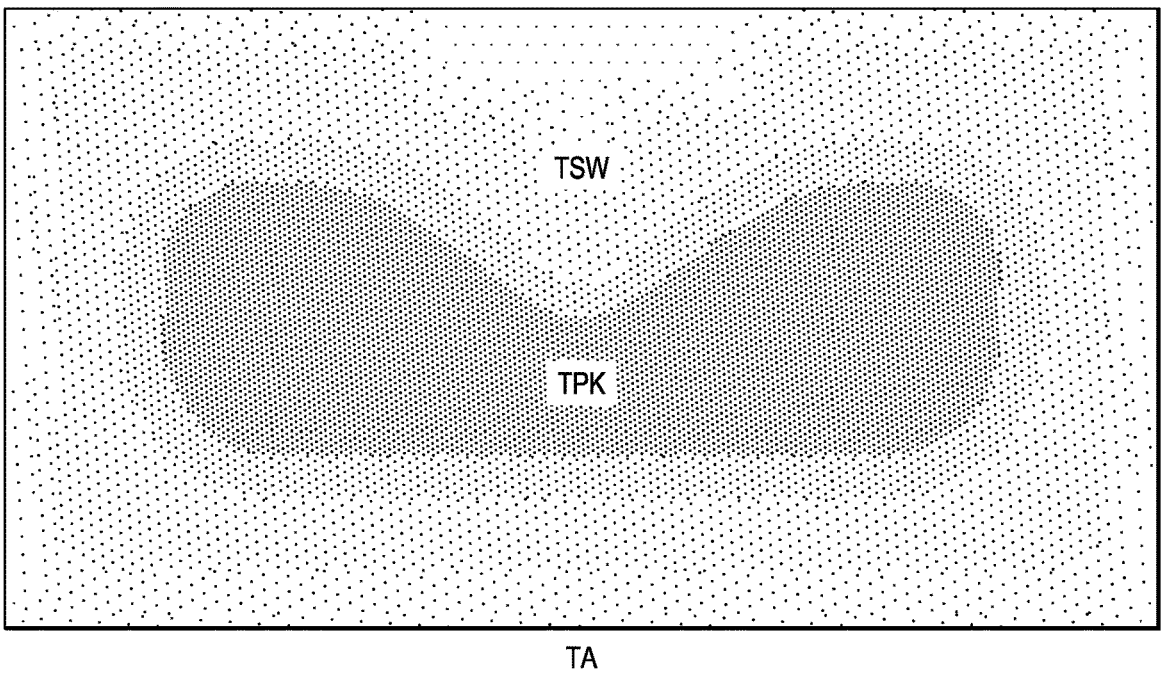
FIG. 16 illustrates an example thermal diagram depicting thermal parameters of a switch device.

FIG. 16 illustrates an example thermal diagram 1600 depicting a thermal temperature gradient of a switch device. In this example, the thermal diagram 1600 shows different shades of gray representing different temperatures across a switch device. An ambient temperature (TA) is shown measured outside the device. A peak temperature (TPK) is shown measured at the darkest region corresponding to the hottest portion of the device. A sensed temperature TSW is shown in another cooler region of the switch device and is often not measured at the peak temperature location TPK since the sensed temperature can occur at a different point than the peak temperature. The relative temperature described herein is the difference between TSW and TA.

Figure 17:
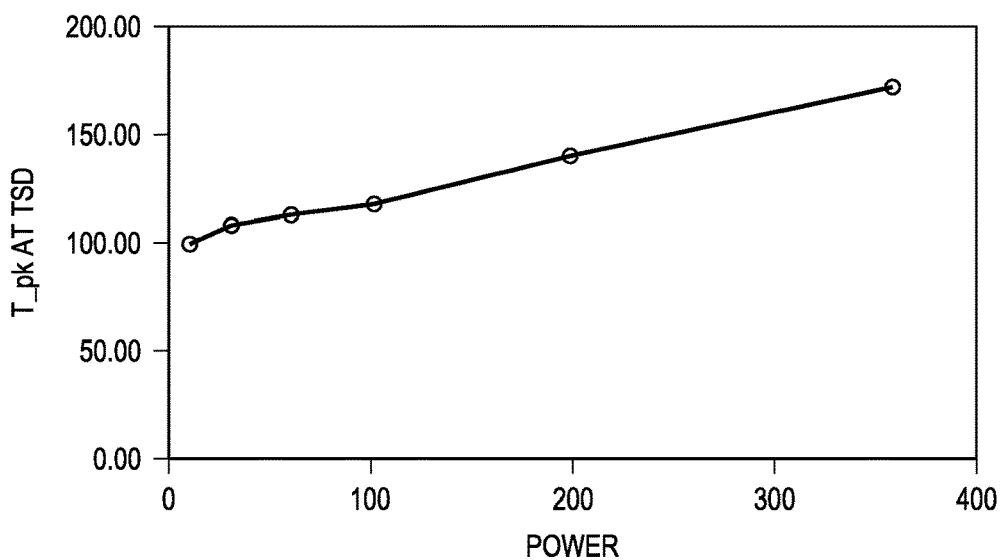
FIG. 17 illustrates example junction temperatures of a switch device versus device power dissipation.

FIG. 17 illustrates example diagram 1700 depicting peak junction temperatures of a switch device at thermal shutdown conditions versus device power dissipation during such conditions. The horizontal axis of the diagram 1700 depicts power of a switch device in Watts (W) and the vertical axis represents peak temperature (TPK) of the switch device in degrees Celsius (C), where ambient temperature for the diagram readings was 27 C. As shown, at lower power levels of the device, lower peak temperatures for the switch device are registered. During these periods of lower power levels, increased transient power can be sourced through the switch device for short periods, as described herein, and without degrading the device during the short transient periods at lower power levels and higher transient power dissipation.

Figure 18:
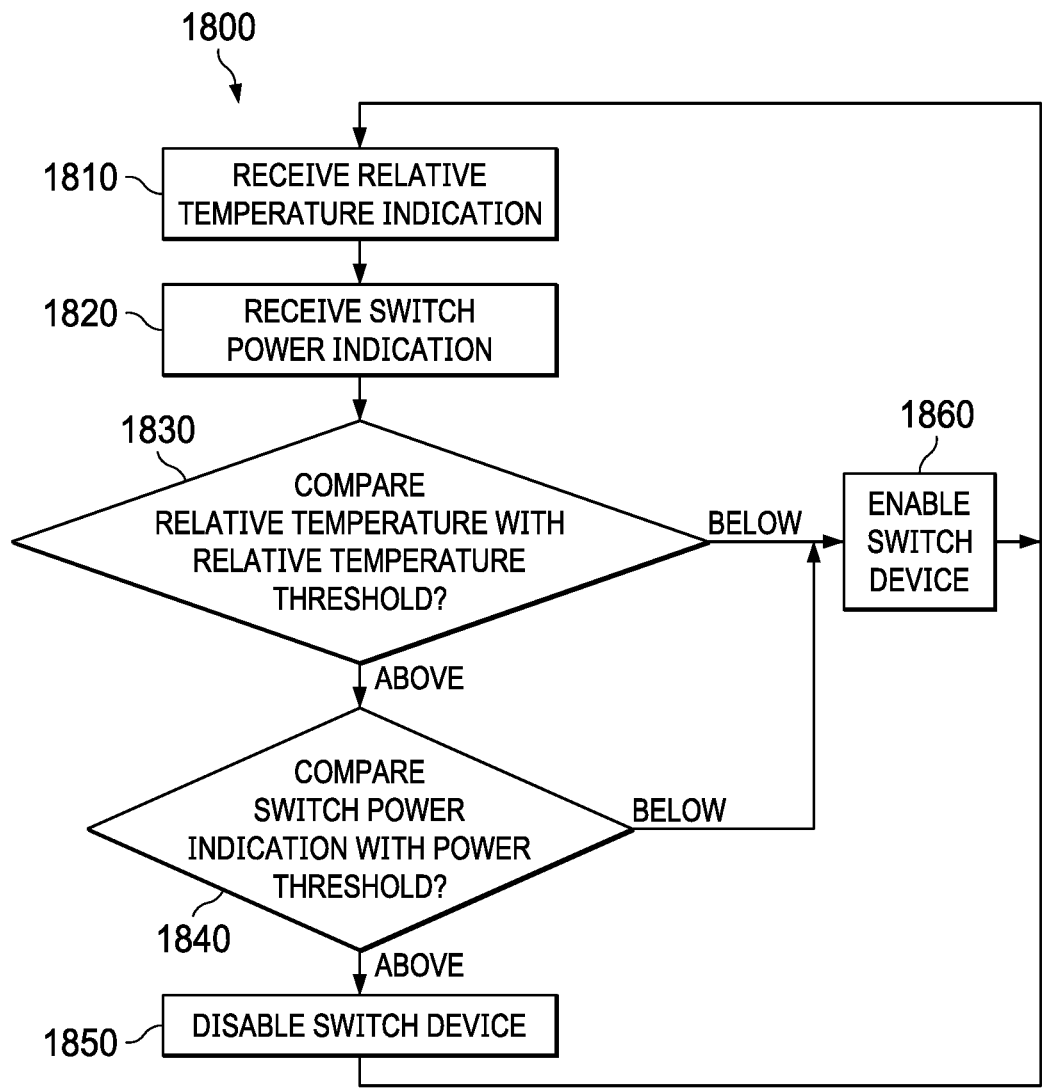
FIG. 18 illustrates an example flow diagram of a method to regulate thermal capacity of a switch device based on detected power levels and sensed temperatures of the device.

FIG. 18 illustrates an example of a method 1800 to regulate thermal capacity of a switch device based on detected power levels and sensed temperatures of the device. At 1810, the method 1800 includes receiving an indication of relative temperature based on a temperature of a switch device and an ambient temperature (e.g., from relative temperature detector 120 of FIG. 1, at 410 of FIG. 4, and 504 of FIG. 5). At 1820, the method 1800 includes receiving an indication of switch power for the switch device (e.g., from power detector 150 of FIG. 1, and 508 of FIG. 5). At 1830, the method 1800 includes comparing the relative temperature indication with a relative temperature threshold to provide a thermal shutdown control signal based on the relative temperature indication being above the threshold (e.g., relative temperature detector 120 of FIG. 1, 410 of FIG. 4, and comparator A1 of FIG. 5). If the relative temperature of the switch device is below the temperature threshold at 1830, the method proceeds to 1860 and enables the switch device (e.g., via gate of FET) to provide power to a load. If the relative temperature indication is above the temperature threshold at 1830, the method 1800 proceeds to 1850. At 1840, the method 1800 includes comparing the switch power indication from 1820 with a power threshold to provide a power level signal (e.g., power detector 150 of FIG. 1, 420 of FIG. 4, and comparator A2 of FIG. 5).

If the switch power level is detected below the power threshold at 1840, the method includes overriding the thermal shutdown signal and the method proceeds to 1860 to enable the switch device. In this example, the method 1800 overrides the relative temperature determination at 1830 and proceeds from 1840 to 1860 to enable the switch device (e.g., overriding thermal shutdown command from relative temperature detector to enable switch device via thermal capacity control 170 of FIG. 1, 210 of FIG. 2, 440 of FIG. 4, and 560 of FIG. 5). If the switch power indication is above the power threshold at 1840 while the relative temperature is above the threshold (as determined at 1830), the method 1800 proceeds to 1850 and disables the switch device.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A device, comprising:
   a relative temperature detector having a relative temperature detector input and a relative temperature detector output, the relative temperature detector configured to determine a temperature difference between a device temperature sensed near a switch device and an ambient temperature sensed outside the switch device, the relative temperature detector configured to provide a relative temperature output signal at the relative temperature detector output responsive to a comparison of the temperature difference to a relative temperature threshold;
   a power detector configured to generate a power level signal based on comparing an indication of switch power of the switch device to a power threshold, wherein the power level signal specifies whether the indication of switch power is above or below the power threshold; and
   a thermal capacity control comprising:
      an AND gate having a first logic input, a second logic input, and a logic output, the first logic input configured to receive the relative temperature output signal, the second logic input configured to receive the power level signal, and the AND gate configured to provide a disable signal at the logic output responsive to the relative temperature output signal indicating that the temperature difference is above the relative temperature threshold and the power level signal indicating that the switch power is above the power threshold;
      a peak detector circuit having a peak detector output, the peak detector configured to provide a peak indicator signal at the peak detector output responsive to the device temperature being above an absolute temperature threshold; and
      an OR gate having first and second OR inputs and an OR output, the first OR input coupled to the logic output, the second OR input coupled to a peak detector output, and the OR output configured to provide a switch turn off signal.

2. The device of claim 1, wherein the thermal capacity control is configured to increase the relative temperature threshold in the relative temperature detector based on the power level signal specifying that the indication of switch power is below the power threshold.

3. The device of claim 1, further comprising a device control circuit configured to enable or disable the switch device in response to a control signal from the thermal capacity control.

4. The device of claim 1, further comprising a device temperature sensor configured to provide an indication of the sensed temperature of the switch device, the device temperature sensor comprising one of a forward diode circuit, a scaled current circuit, or a temperature-dependent resistor circuit; and
   an ambient temperature sensor configured to provide an indication of the sensed temperature of the ambient temperature outside the switch device, the ambient temperature sensor comprising one of a forward diode circuit, a scaled current circuit, or a temperature-dependent resistor circuit.

5. The device of claim 1, wherein the power detector further comprises a comparator circuit configured to compare a voltage potential across the switch device with respect to a power threshold voltage to generate the power level signal based on the comparison.

6. The device of claim 1, wherein the power detector further comprises a trans-linear circuit configured to perform a multiplication of a voltage potential across the switch device with respect to output current of the switch device to generate the power level signal.

7. The device of claim 1, wherein the relative temperature detector includes a subtraction circuit configured to determine the temperature difference between the device temperature and the ambient temperature.

8. The device of claim 1, wherein the thermal capacity control is configured to enable the switch device to provide power based on the power level signal specifying the indication of switch power is below the power threshold.

9. The device of claim 1, the thermal capacity control configured to select the relative temperature threshold to be either a first non-zero threshold or a second non-zero threshold responsive to the power level signal.

10. The device of claim 9, wherein the thermal capacity control is configured to select the first non-zero threshold based on the power level signal specifying that the indication of switch power is below the power threshold, and to select the second non-zero threshold based on the power level signal specifying that the indication of switch power is above the power threshold.

11. The device of claim 9, wherein the first non-zero threshold and the second non-zero threshold are stored in memory.

12. The device of claim 9, wherein the first non-zero threshold and the second non-zero threshold are stored in registers.

13. A circuit, comprising:
- a first subtractor having a first subtractor input, a second subtractor input, and a first subtractor output, the first subtractor input configured to receive an ambient temperature measurement signal indicating a temperature outside a switch device, and the second subtractor input configured to receive a device temperature measurement signal indicating a temperature near the switch device;
- a first comparator having a first comparator input, a second comparator input, and a first comparator output, the first comparator input coupled to the first subtractor output, and the second comparator input configured to receive a relative temperature threshold;
- a second subtractor having a third subtractor input, a fourth subtractor input, and a second subtractor output, the third subtractor input coupled to a drain of the switch device and the fourth subtractor input coupled to a source of the switch device;
- a second comparator having a third comparator input, a fourth comparator input, and a second comparator output, the third comparator input coupled to the second subtractor output and the fourth comparator input configured to receive a power threshold; and
- an AND gate having a first logic input, a second logic input, and a logic output, the first logic input coupled to the first comparator output and the second logic input coupled to the second comparator output.

14. The circuit of claim 13, wherein the logic output is a first logic output, the circuit further comprising an OR gate having a third logic input, a fourth logic input, and a second logic output, the third logic input coupled to the first logic output.

15. The circuit of claim 14, further comprising a third comparator having a fifth comparator input, a sixth comparator input, and a third comparator output, the fifth comparator input configured to receive the device temperature measurement signal, the sixth comparator input configured to receive an absolute temperature threshold, and the third comparator output coupled to the fourth logic input.

16. The circuit of claim 15, wherein the second logic output is coupled to a gate of the switch device.

17. The circuit of claim 13, further comprising a device temperature sensor configured to provide the device temperature measurement signal, the device temperature sensor comprising a forward diode circuit, a scaled current circuit, or a temperature-dependent resistor circuit; and an ambient temperature sensor configured to provide the ambient temperature measurement signal, the ambient temperature sensor comprising a forward diode circuit, a scaled current circuit, or a temperature-dependent resistor circuit.

18. A circuit comprising:
- a switch device having a gate, a source, and a drain,
- a first subtractor having a first subtractor input, a second subtractor input, and a first subtractor output, the first subtractor input configured to receive an ambient temperature measurement signal indicating a temperature outside the switch device, and the second subtractor input configured to receive a device temperature measurement signal indicating a temperature near the switch device;
- a first comparator having a first comparator input, a second comparator input, and a first comparator output, the first comparator input coupled to the first subtractor output, and the second comparator input configured to receive a relative temperature threshold;
- a second subtractor having a third subtractor input, a fourth subtractor input, and a second subtractor output, the third subtractor input coupled to the drain of the switch device and the fourth subtractor input coupled to the source of the switch device;
- a second comparator having a third comparator input, a fourth comparator input, and a second comparator output, the third comparator input coupled to the second subtractor output and the fourth comparator input configured to receive a power threshold; and
- an AND gate having a first logic input, a second logic input, and a logic output, the first logic input coupled to the first comparator output and the second logic input coupled to the second comparator output.

19. The circuit of claim 18, wherein the logic output is a first logic output, the circuit further comprising an OR gate having a third logic input, a fourth logic input, and a second logic output, the third logic input coupled to the first logic output and the second logic output coupled to the gate of the switch device.

20. The circuit of claim 19, further comprising a third comparator having a fifth comparator input, a sixth comparator input, and a third comparator output, the fifth comparator input configured to receive the device temperature measurement signal, the sixth comparator input configured to receive an absolute temperature threshold, and the third comparator output coupled to the fourth logic input.

* * * * *